(12) United States Patent
Chang et al.

(10) Patent No.: US 10,051,748 B2
(45) Date of Patent: Aug. 14, 2018

(54) CIRCUIT STRUCTURE AND MANUFACTURING METHOD THEREOF

(71) Applicant: Unimicron Technology Corp., Taoyuan (TW)

(72) Inventors: Hung-Lin Chang, Taoyuan (TW); Ming-Hao Wu, Taoyuan (TW); Syun-Siao Chang, Taoyuan (TW); Cheng-Po Yu, Taoyuan (TW); Chi-Min Chang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/997,583

(22) Filed: Jan. 18, 2016

(65) Prior Publication Data

US 2017/0164468 A1    Jun. 8, 2017

(30) Foreign Application Priority Data

Dec. 3, 2015   (TW) .............................. 104140604 A

(51) Int. Cl.
*H05K 1/09* (2006.01)
*H05K 3/46* (2006.01)

(52) U.S. Cl.
CPC ......... *H05K 3/4697* (2013.01); *H05K 3/4644* (2013.01)

(58) Field of Classification Search
CPC .................. H05K 3/4697; H05K 3/4644
USPC ................. 174/251, 250, 255–258, 261, 262
See application file for complete search history.

(56) References Cited

U.S. PATENT DOCUMENTS

| 8,587,132 B2 * | 11/2013 | Zhao | H01L 24/17 257/686 |
| 9,549,468 B1 * | 1/2017 | Tsai | H05K 1/115 |
| 2006/0186536 A1 * | 8/2006 | Hsu | H01L 23/36 257/720 |

FOREIGN PATENT DOCUMENTS

TW    M397681    2/2011

* cited by examiner

*Primary Examiner* — Tremesha S Willis
(74) *Attorney, Agent, or Firm* — JCIPRNET

(57) ABSTRACT

A manufacturing method of a circuit board structure is described as follows. An inner circuit structure including a core layer having an upper and an opposite lower surface, a first patterned circuit layer disposed on the upper surface and a second patterned circuit layer disposed on the lower surface is provided. An insulating material layer is formed on a portion of the first patterned circuit layer. A laser resisting layer is formed on at least a portion of the insulating material layer. A release layer is adhered to the laser resisting layer. A build-up process is performed so as to laminate a first and a second build-up circuit structures on the first and the second patterned circuit layers, respectively. A laser ablation process is performed on the first build-up circuit structure so as to form a cavity at least exposing a portion of the upper surface of the core layer.

6 Claims, 12 Drawing Sheets

CIRCUIT STRUCTURE AND MANUFACTURING METHOD THEREOF

CROSS-REFERENCE TO RELATED APPLICATION

This application claims the priority benefit of Taiwan application serial no. 104140604, filed on Dec. 3, 2015. The entirety of the above-mentioned patent application is hereby incorporated by reference herein and made a part of this specification.

BACKGROUND OF THE INVENTION

Field of the Invention

The invention relates to a circuit board structure and a manufacturing method thereof. More particularly, the invention relates to a circuit board structure having a cavity and a manufacturing method thereof.

Description of Related Art

Generally, to manufacture a circuit board structure having a cavity, it is necessary to fabricate an alignment copper layer on a core layer of an inner circuit layer. The purpose thereof is that during a subsequent process of forming the cavity by performing laser ablation on the circuit structure, the alignment copper layer serves not only as a laser resisting layer for preventing excessive ablation of the circuit structure, but also as a laser alignment pattern that facilitates the laser ablation process. However, since the alignment copper layer is directly formed on the core layer of the inner circuit layer, the circuit layout of the core layer is limited, thus reducing layout flexibility of the core layer.

SUMMARY OF THE INVENTION

The invention provides a circuit board structure having better layout flexibility.

The invention also provides a manufacturing method of a circuit board structure used for manufacturing the above-mentioned circuit board structure.

The manufacturing method of a circuit board structure of the invention includes the following manufacturing steps. An inner circuit structure is provided. The inner circuit structure includes a core layer having an upper surface and an opposite lower surface, a first patterned circuit layer disposed on the upper surface and a second patterned circuit layer disposed on the lower surface. An insulating material layer is formed on a portion of the first patterned circuit layer, wherein the insulating material layer covers a portion of the upper surface. A laser resisting layer is formed on at least a portion of the insulating material layer. A release layer is adhered to at least the laser resisting layer. A build-up process is performed so as to laminate a first build-up circuit structure and a second build-up circuit structure on the first patterned circuit layer and the second patterned circuit layer, respectively, wherein the first build-up circuit structure covers the release layer. A laser ablation process is performed on the first build-up circuit structure to irradiate a laser beam on the laser resisting layer so as to remove a portion of the first build-up circuit structure and the release layer, and thereby a cavity at least exposing a portion of the upper surface of the core layer is formed.

In an embodiment of the invention, the step of forming the insulating material layer includes the following. A dielectric layer having a through hole is provided. An insulating material is filled into the through hole of the dielectric layer to form the insulating material layer, wherein the insulating material covers a portion of the first patterned circuit layer, and the dielectric layer covers a portion of the upper surface of the core layer.

In an embodiment of the invention, a material of the insulating material is an ink, the laser resisting layer at least covers a portion of the insulating material, and the release layer covers the laser resisting layer.

In an embodiment of the invention, a method of forming the insulating material layer is a coating method, and a material of the insulating material layer is an ink.

In an embodiment of the invention, a material of the laser resisting layer is a metal material, and the release layer at least covers the laser resisting layer and the insulating material layer.

In an embodiment of the invention, the laser resisting layer is completely formed on the insulating material layer, and the release layer further covers a portion of the first patterned circuit layer.

In an embodiment of the invention, the manufacturing method of a circuit board structure further includes the following. After the laser ablation process is performed on the first build-up circuit structure to remove the portion of the first build-up circuit structure and the release layer, the laser resisting layer is removed, and thereby a cavity exposing the insulating material layer and a portion of the upper surface of the core layer is formed.

In an embodiment of the invention, the manufacturing method of a circuit board structure further includes the following. While the laser ablation process is performed on the first build-up circuit structure to remove the portion of the first build-up circuit structure and the release layer, at least a portion of the laser resisting layer and at least a portion of the insulating material layer are removed, and thereby a cavity exposing a portion of the insulating material layer, a portion of the laser resisting layer and a portion of the upper surface of the core layer is formed.

In an embodiment of the invention, the manufacturing method of a circuit board structure further includes the following. After the laser ablation process is performed on the first build-up circuit structure to remove the portion of the first build-up circuit structure and the release layer, the laser resisting layer and the insulating material layer are removed, and thereby a cavity exposing a portion of the insulating material layer, a portion of the laser resisting layer and a portion of the upper surface of the core layer is formed.

In an embodiment of the invention, the cavity includes a plurality of side walls having a concave-and-convex profile, a plane profile, or a combination thereof.

In an embodiment of the invention, a material of the laser resisting layer is the same as a material of the insulating material layer. The laser resisting layer covers a portion of the insulating material layer, the release layer covers the insulating material layer and the laser resisting layer, and the cavity exposes the laser resisting layer, the insulating material layer and a portion of the upper surface of the core layer.

In an embodiment of the invention, the laser resisting layer has a ring-shaped structure, and a portion of the first patterned circuit layer is located in the ring-shaped structure.

In an embodiment of the invention, the first build-up circuit structure includes at least one first dielectric layer, at least one first patterned conductive layer, and at least one first conductive through hole structure passing through the first dielectric layer. The first dielectric layer and the first patterned conductive layer are stacked in sequence on the upper surface of the core layer, and the first patterned conductive layer is electrically connected to the first patterned circuit layer through the first conductive through hole structure. The second build-up circuit structure includes at least one second dielectric layer, at least one second patterned conductive layer, and at least one second conductive through hole structure passing through the second dielectric layer. The second dielectric layer and the second patterned conductive layer are stacked in sequence on the lower surface of the core layer, and the second patterned conductive layer is electrically connected to the second patterned circuit layer through the second conductive through hole structure.

The circuit board structure according to the invention includes an inner circuit structure, a first build-up circuit structure and a second build-up circuit structure. The inner circuit structure includes a core layer having an upper surface and an opposite lower surface, a first patterned circuit layer disposed on the upper surface and a second patterned circuit layer disposed on the lower surface. The first build-up circuit structure is disposed on the upper surface of the core layer and covers the first patterned circuit layer, wherein the first build-up circuit structure has a cavity, the cavity exposes a portion of the first patterned circuit layer and a portion of the upper surface of the core layer and includes a plurality of side walls, and the side walls have a concave-and-convex profile, or a combination of concave-and-convex and plane profiles. The second build-up circuit structure is disposed on the lower surface of the core layer and covers the second patterned circuit layer.

In an embodiment of the invention, the first build-up circuit structure includes at least one first dielectric layer, at least one first patterned conductive layer, and at least one first conductive through hole structure passing through the first dielectric layer. The first dielectric layer and the first patterned conductive layer are stacked in sequence on the upper surface of the core layer, and the first patterned conductive layer is electrically connected to the first patterned circuit layer through the first conductive through hole structure. The second build-up circuit structure includes at least one second dielectric layer, at least one second patterned conductive layer, and at least one second conductive through hole structure passing through the second dielectric layer. The second dielectric layer and the second patterned conductive layer are stacked in sequence on the lower surface of the core layer, and the second patterned conductive layer is electrically connected to the second patterned circuit layer through the second conductive through hole structure.

The circuit board structure according to the invention includes an inner circuit structure, a first build-up circuit structure, an insulating material layer, a laser resisting layer, and a second build-up circuit structure. The inner circuit structure includes a core layer having an upper surface and an opposite lower surface, a first patterned circuit layer disposed on the upper surface and a second patterned circuit layer disposed on the lower surface. The first build-up circuit structure is disposed on the upper surface of the core layer and covers the first patterned circuit layer, wherein the first build-up circuit structure has a cavity, and the cavity exposes a portion of the first patterned circuit layer and a portion of the upper surface of the core layer. The insulating material layer is disposed on the portion of the first patterned circuit layer exposed by the cavity. The laser resisting layer is disposed on the insulating material layer, wherein the laser resisting layer has a ring-shaped structure, and a portion of the first patterned circuit layer is located in the ring-shaped structure. The second build-up circuit structure is disposed on the lower surface of the core layer and covers the second patterned circuit layer.

In an embodiment of the invention, a material of the laser resisting layer is a metal material.

In an embodiment of the invention, a material of the laser resisting layer is the same as a material of the insulating material layer.

In an embodiment of the invention, the first build-up circuit structure includes at least one first dielectric layer, at least one first patterned conductive layer, and at least one first conductive through hole structure passing through the first dielectric layer. The first dielectric layer and the first patterned conductive layer are stacked in sequence on the upper surface of the core layer, and the first patterned conductive layer is electrically connected to the first patterned circuit layer through the first conductive through hole structure. The second build-up circuit structure includes at least one second dielectric layer, at least one second patterned conductive layer, and at least one second conductive through hole structure passing through the second dielectric layer. The second dielectric layer and the second patterned conductive layer are stacked in sequence on the lower surface of the core layer, and the second patterned conductive layer is electrically connected to the second patterned circuit layer through the second conductive through hole structure.

Based on the above, during the manufacture of the circuit board structure of the invention, the laser resisting layer is formed on the insulating material layer instead of the inner circuit structure. Therefore, subsequently, after the build-up circuit structures are fabricated, when the laser ablation process is performed to form the cavity that exposes the upper surface of the core layer of the inner circuit structure, the circuit layout of the core layer of the inner circuit structure will not be affected. That is, circuit designing can still be carried out in the resulting cavity. Therefore, the circuit board structure formed in the invention provides larger layout space.

To make the above features and advantages of the invention more comprehensible, embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1A:
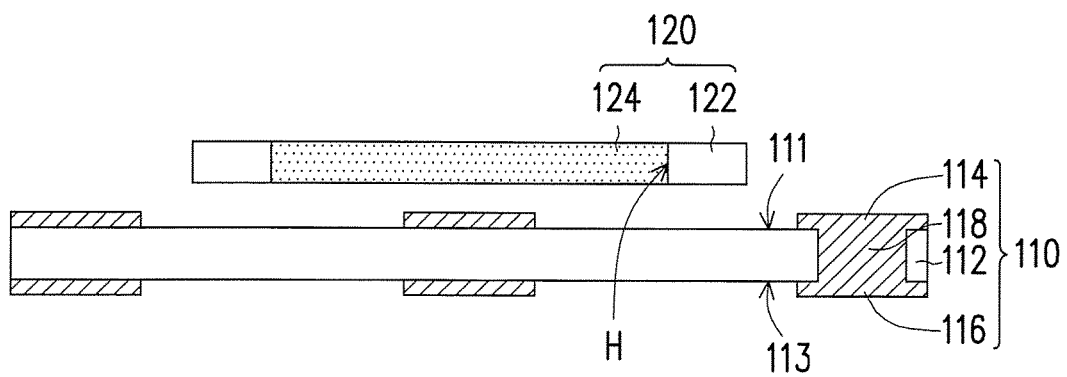
FIG. 1A(a) to FIG. 1J illustrate cross-sectional schematic views of a manufacturing method of a circuit board structure according to an embodiment of the invention.
Figure 1A:
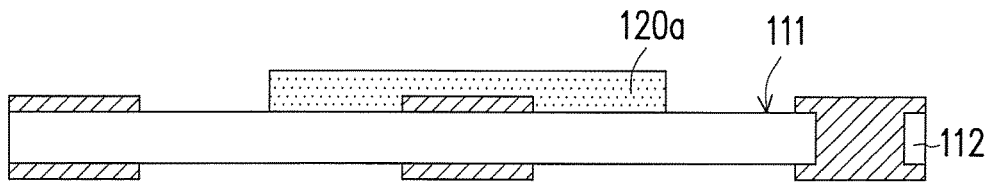
Figure 1B:
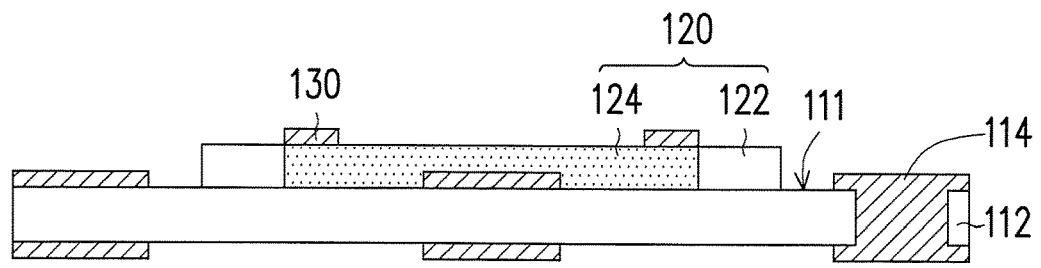
Figure 1B:
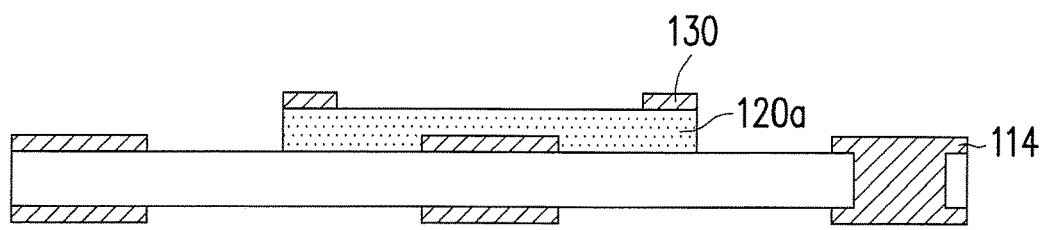
Figure 1C:
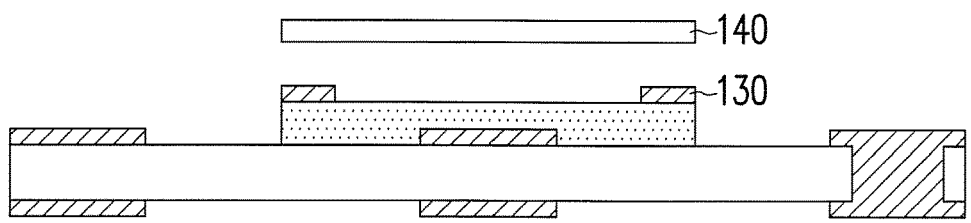
Figure 1D:
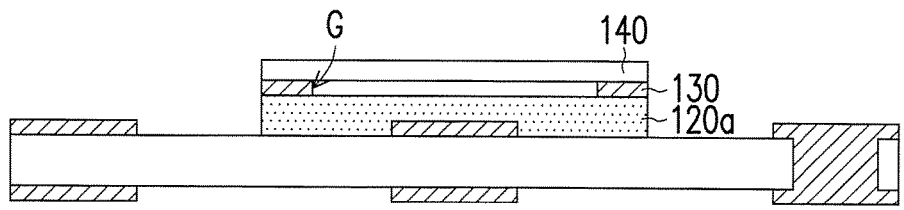
Figure 1E:
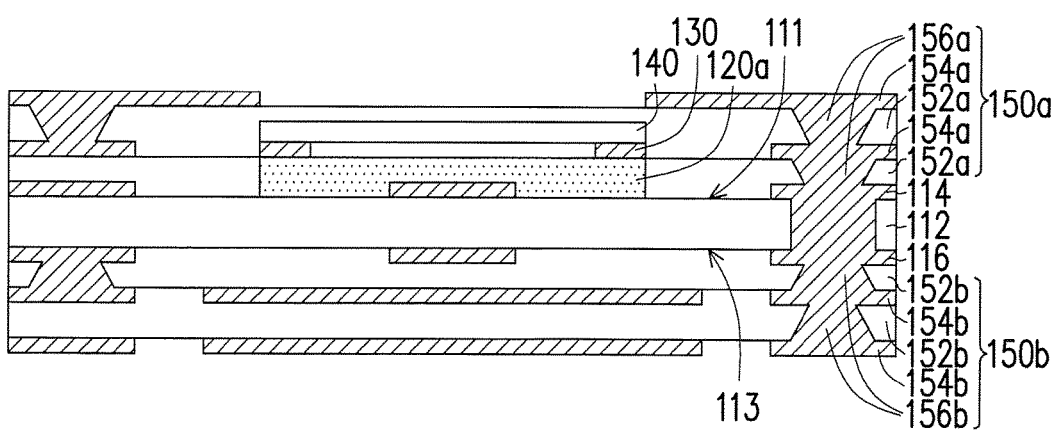
Figure 1F:
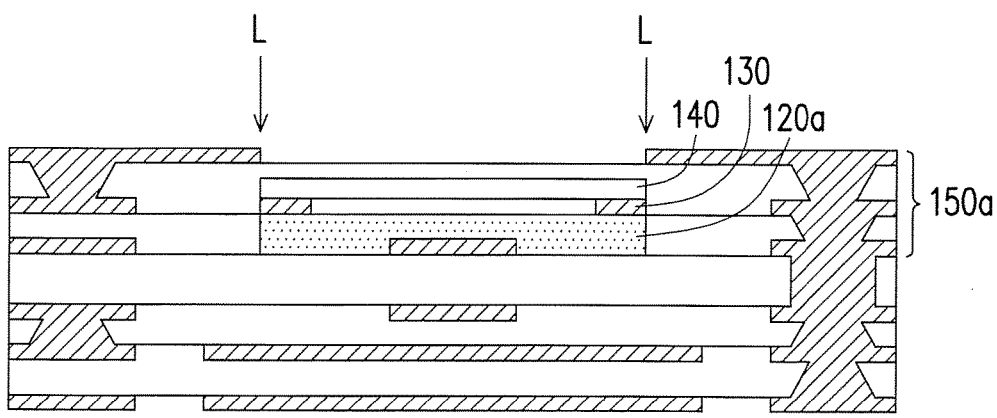
Figure 1G:
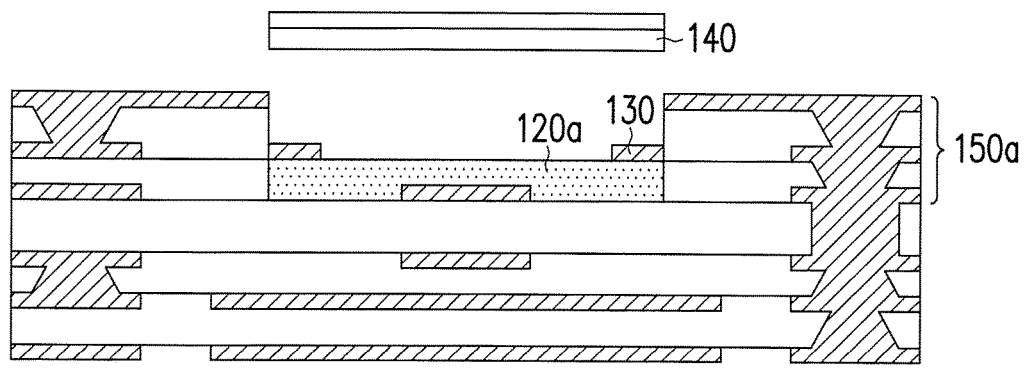
Figure 1H:
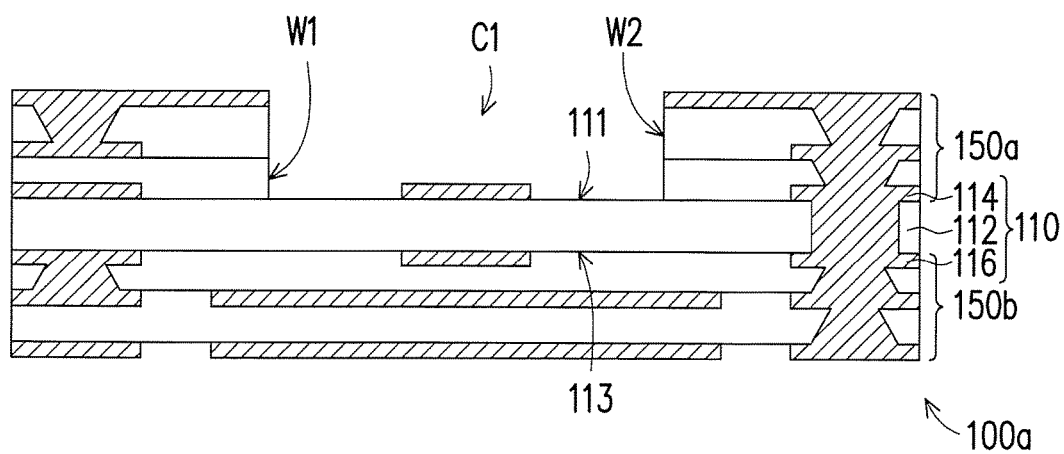
Figure 1I:
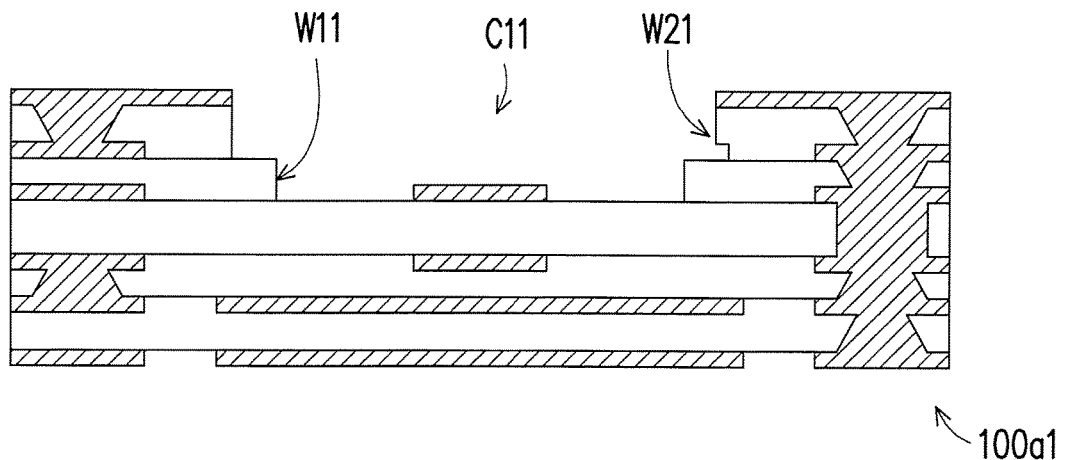
Figure 1J:
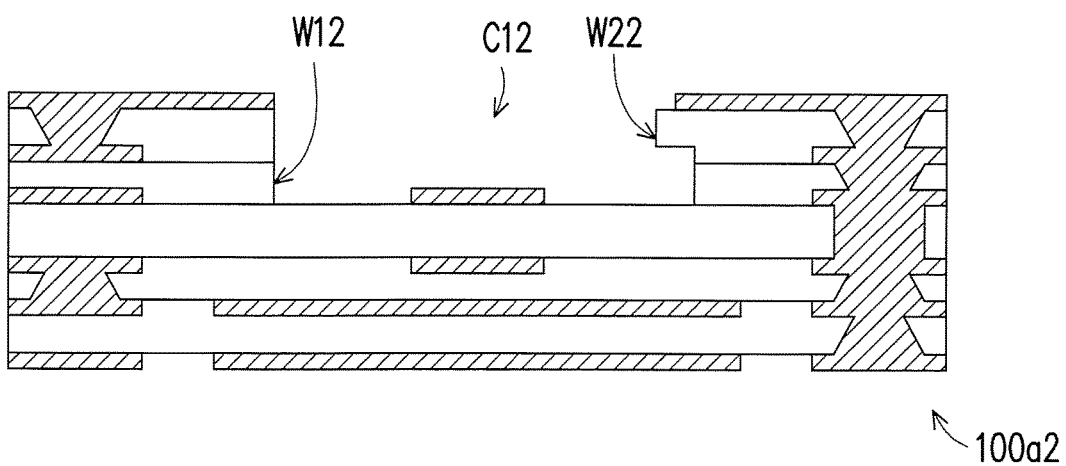

FIG. 1A(a) to FIG. 1J illustrate cross-sectional schematic views of a manufacturing method of a circuit board structure according to an embodiment of the invention. Referring first to FIG. 1A(a), with regard to the manufacturing method of a circuit board structure according to the present embodiment, first of all, an inner circuit structure 110 is provided, wherein the inner circuit structure 110 includes a core layer 112 having an upper surface 111 and an opposite lower surface 113, a first patterned circuit layer 114 disposed on the upper surface 111 and a second patterned circuit layer 116 disposed on the lower surface 113. As shown in FIG. 1A(a), the first patterned circuit layer 114 and the second patterned circuit layer 116 are electrically connected through at least one conductive through hole 118 passing through the core layer 112.

Next, referring to FIG. 1A(a) and FIG. 1B(a) together, an insulating material layer 120 is formed on a portion of the first patterned circuit layer 114, wherein the insulating material layer 120 covers a portion of the upper surface 111. In detail, the step of forming the insulating material layer 120 includes the following. A dielectric layer 122 having a through hole H is provided. Then, an insulating material 124 is filled into the through hole H of the dielectric layer 122 to form the insulating material layer 120, wherein the insulating material 124 covers a portion of the first patterned circuit layer 114, and the dielectric layer 122 covers a portion of the upper surface 111 of the core layer 112. Herein, a material of the insulating material 124 is, e.g., an ink, polypropylene (PP), polyethylene (PE), ABS (acrylonitrile butadiene styrene) resin, polytetrafluoroethene (PTFE) or other suitable material.

It should be noted that the present embodiment does not impose any limitation on the method of forming the insulating material layer 120. In other embodiments, e.g., with reference to FIG. 1A(b), an insulating material layer 120a is formed on the upper surface 111 of the core layer 112 by a coating method, wherein a material of the insulating material layer 120a is, e.g., an ink, and this method still falls within the scope to be protected by the invention.

Next, referring to FIG. 1B(a) and FIG. 1B(b) together, a laser resisting layer 130 is formed on at least a portion of the insulating material layers 120 and 120a, wherein the laser resisting layer 130 at least covers a portion of the insulating material 124 of the insulating material layer 120 and a portion of the insulating material layer 120a. As shown in FIG. 1B(a) and FIG. 1B(b), the laser resisting layer 130 of the present embodiment does not completely cover the insulating material layers 120 and 120a. Specifically, the laser resisting layer 130 has a ring-shaped structure, wherein an area where the laser resisting layer 130 is present is an area where subsequent laser ablation is performed, and a portion of the first patterned circuit layer 114 is located in the ring-shaped structure. Herein, a material of the laser resisting layer 130 is, e.g., metal (copper, nickel, gold, silver, aluminum or other suitable metal material), or non-metal (ceramic, quartz, carborundum or other suitable non-metal material).

To facilitate explanation, the steps subsequent to the step in FIG. 1B(b) are described for exemplary purposes. Referring to FIG. 1C and FIG. 1D together, a release layer 140 is adhered to at least the laser resisting layer 130. As shown in FIG. 1D, the release layer 140 only directly covers the laser resisting layer 130, and is spaced apart from the insulating material layer 120a by an air gap G, wherein the release layer 140 does not cover the insulating material layer 120a, and an edge of the release layer 140 is specifically aligned with an edge of the laser resisting layer 130.

Next, referring to FIG. 1E, a build-up process is performed so as to laminate a first build-up circuit structure 150a and a second build-up circuit structure 150b on the first patterned circuit layer 114 and the second patterned circuit layer 116, respectively, wherein the first build-up circuit structure 150a covers the release layer 140. In detail, the first build-up circuit structure 150a of the present embodiment includes at least one first dielectric layer 152a, at least one first patterned conductive layer 154a, and at least one first conductive through hole structure 156a passing through the first dielectric layer 152a. The first dielectric layer 152a and the first patterned conductive layer 154a are stacked in sequence on the upper surface 111 of the core layer 112, and the first patterned conductive layer 154a is electrically connected to the first patterned circuit layer 114 through the first conductive through hole structure 156a. The second build-up circuit structure 150b includes at least one second dielectric layer 152b, at least one second patterned conductive layer 154b, and at least one second conductive through hole structure 156b passing through the second dielectric layer 152b. The second dielectric layer 152b and the second patterned conductive layer 154b are stacked in sequence on the lower surface 113 of the core layer 112, and the second patterned conductive layer 154b is electrically connected to the second patterned circuit layer 116 through the second conductive through hole structure 156b.

Then, referring to FIG. 1F, FIG. 1G and FIG. 1H together, a laser ablation process is performed on the first build-up circuit structure 150a to irradiate a laser beam L on the laser resisting layer 130 so as to remove a portion of the first build-up circuit structure 150a and the release layer 140, and thereby a cavity C1 at least exposing a portion of the upper surface 111 of the core layer 112 is formed. In detail, as shown in FIG. 1F and FIG. 1G, the laser beam L is irradiated only on an area where the laser resisting layer 130 is disposed, and a portion of the first build-up circuit structure 150a and the release layer 140 are removed by the irradiation with the laser beam L. Next, as shown in FIG. 1G and FIG. 1H, a lye (pH>12) or an organic solvent is used to remove the insulation material layer 120a and the laser resisting layer 130 disposed thereon, so as to form the cavity C1 exposing a portion of the upper surface 111 of the core layer 112. At this moment, the cavity C1 includes a plurality of side walls W1 and W2, and the side walls W1 and W2 specifically have a plane profile. However, the invention is not limited thereto. Up to this step, the manufacture of a circuit board structure 100a has been completed.

It should be noted that in other embodiments, due to different positions on which the laser ablation is performed, the resulting cavity may have side walls having different profiles. Referring to FIG. 1I, side walls W11 and W21 of a cavity C11 specifically have a concave-and-convex profile; or, referring to FIG. J, side walls W12 and W22 of a cavity C12 specifically have a combination of concave-and-convex and plane profiles. The above technical features still fall within the scope to be protected by the invention.

In terms of structure, referring again to FIG. 1H, the circuit board structure 100a of the present embodiment includes the inner circuit structure 110, the first build-up circuit structure 150a and the second build-up circuit structure 150b. The inner circuit structure 110 includes the core layer 112 having the upper surface 111 and the opposite lower surface 113, the first patterned circuit layer 114 disposed on the upper surface 111 and the second patterned circuit layer 116 disposed on the lower surface 113. The first build-up circuit structure 150a is disposed on the upper surface 111 of the core layer 112 and covers the first patterned circuit layer 114, wherein the first build-up circuit structure 150a has the cavity C1, the cavity C1 exposes a portion of the first patterned circuit layer 114 and a portion of the upper surface 111 of the core layer 112 and includes a plurality of side walls W1 and W2, and the side walls W1 and W2 specifically have a plane profile. The second build-up circuit structure 150b is disposed on the lower surface 113 of the core layer 112 and covers the second patterned circuit layer 116.

It should be noted that the invention does not impose any limitation on the profile of the side walls of the cavity. Referring to FIG. 1I, the side walls W11 and W21 of the cavity C11 of a circuit board structure 100a1 specifically have a concave-and-convex profile; or, referring to FIG. 1J, the side walls W12 and W22 of the cavity C12 of a circuit board structure 100a2 specifically have a combination of concave-and-convex and plane profiles. The above technical features still fall within the scope to be protected by the invention.

During the manufacture of the circuit board structure 100a of the present embodiment, the laser resisting layer 130 is formed on the insulating material layer 120a instead of the inner circuit structure 110. Therefore, subsequently, after the first build-up circuit structure 150a and the second build-up circuit structure 150b are fabricated, when the laser ablation process is performed to form the cavity C1 that exposes the upper surface 111 of the core layer 112 of the inner circuit structure 110, the circuit layout of the core layer 112 of the inner circuit structure 110 will not be affected. That is, circuit designing can still be carried out in the resulting cavity C1. Therefore, the circuit board structure 100a formed in the present embodiment provides larger layout space.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2A:
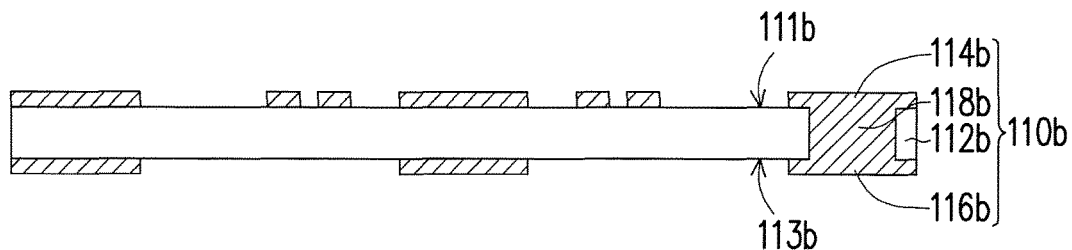
FIG. 2A to FIG. 2F illustrate cross-sectional schematic views of a manufacturing method of a circuit board structure according to another embodiment of the invention.

FIG. 2A to FIG. 2F illustrate cross-sectional schematic views of a manufacturing method of a circuit board structure according to another embodiment of the invention. Referring to FIG. 2A, with regard to the manufacturing method of a circuit board structure according to the present embodiment, first of all, an inner circuit structure 110b is provided, wherein the inner circuit structure 110b includes a core layer 112b having an upper surface 111b and an opposite lower surface 113b, a first patterned circuit layer 114b disposed on the upper surface 111b and a second patterned circuit layer 116b disposed on the lower surface 113b. As shown in FIG. 2A, the first patterned circuit layer 114b and the second patterned circuit layer 116b are electrically connected through at least one conductive through hole 118b passing through the core layer 112b.

Figure 2B:
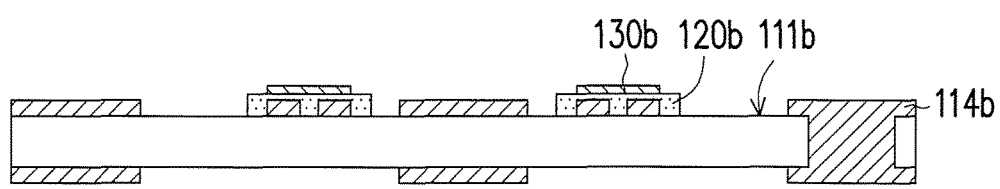

Next, referring to FIG. 2B, an insulating material layer 120b is formed on a portion of the first patterned circuit layer 114b, wherein the insulating material layer 120b covers a portion of the upper surface 111b. Herein, a material of the insulating material layer 120b is, e.g., ink, polypropylene (PP), polyethylene (PE), ABS (acrylonitrile butadiene styrene) resin, polytetrafluoroethene (PTFE) or other suitable material. Next, referring again to FIG. 2B, a laser resisting layer 130b is formed on the insulating material layer 120b. As shown in FIG. 2B, the laser resisting layer 130b of the present embodiment is completely formed on the insulating material layer 120b, but does not completely cover the insulating material layer 120b. Specifically, the laser resisting layer 130b has a ring-shaped structure, wherein an area where the laser resisting layer 130b is present is an area where subsequent laser ablation is performed, and a portion of the first patterned circuit layer 114b is located in the ring-shaped structure. Herein, a material of the laser resisting layer 130b is, e.g., a metal material (e.g., copper, nickel, gold, silver, aluminum or other suitable metal material), or non-metal (e.g., ceramic, quartz, carborundum or other suitable non-metal material).

Figure 2C:
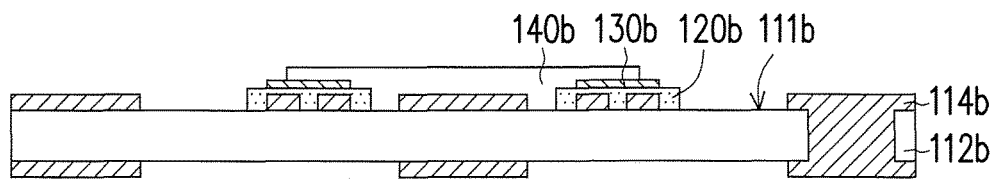

Next, referring to FIG. 2C, a release layer 140b is adhered to at least the laser resisting layer 130b, wherein the release layer 140b at least covers the laser resisting layer 130b and the insulating material layer 120b. As shown in FIG. 2C, the release layer 140b directly covers a portion of the first patterned circuit layer 114b, a portion of the upper surface 111b of the core layer 112b, a portion of the insulating material layer 120b, and a portion of the laser resisting layer 130b. In other words, a portion of the laser resisting layer 130b and a portion of the insulating material layer 120b are not covered by the release layer 140b.

Figure 2D:
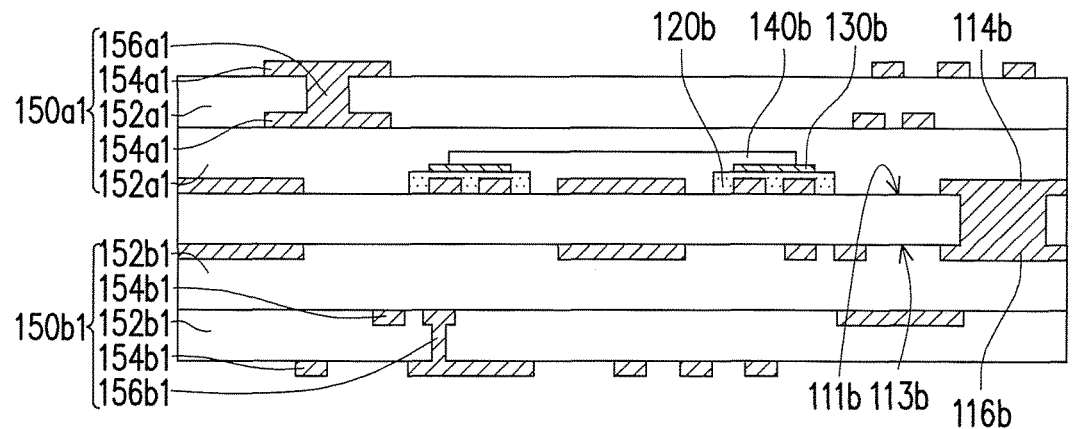

Then, referring to FIG. 2D, a build-up process is performed so as to laminate a first build-up circuit structure 150a1 and a second build-up circuit structure 150b1 on the first patterned circuit layer 114b and the second patterned circuit layer 116b, respectively, wherein the first build-up circuit structure 150a1 covers the release layer 140b, a portion of the laser resisting layer 130b and a portion of the insulating material layer 120b. In detail, the first build-up circuit structure 150a1 of the present embodiment includes at least one first dielectric layer 152a1, at least one first patterned conductive layer 154a1, and at least one first conductive through hole structure 156a1 passing through the first dielectric layer 152a1. The first dielectric layer 152a1 and the first patterned conductive layer 154a1 are stacked in sequence on the upper surface 111b of the core layer 112b, and the first patterned conductive layer 154a1 is electrically connected to the first patterned circuit layer 114b through the first conductive through hole structure 156a1. The second build-up circuit structure 150b1 includes at least one second dielectric layer 152b1, at least one second patterned conductive layer 154b1, and at least one second conductive through hole structure 156b1 passing through the second dielectric layer 152b1. The second dielectric layer 152b1 and the second patterned conductive layer 154b1 are stacked in sequence on the lower surface 113b of the core layer 112b, and the second patterned conductive layer 154b1 is electrically connected to the second patterned circuit layer 116b through the second conductive through hole structure 156b1.

Figure 2E:
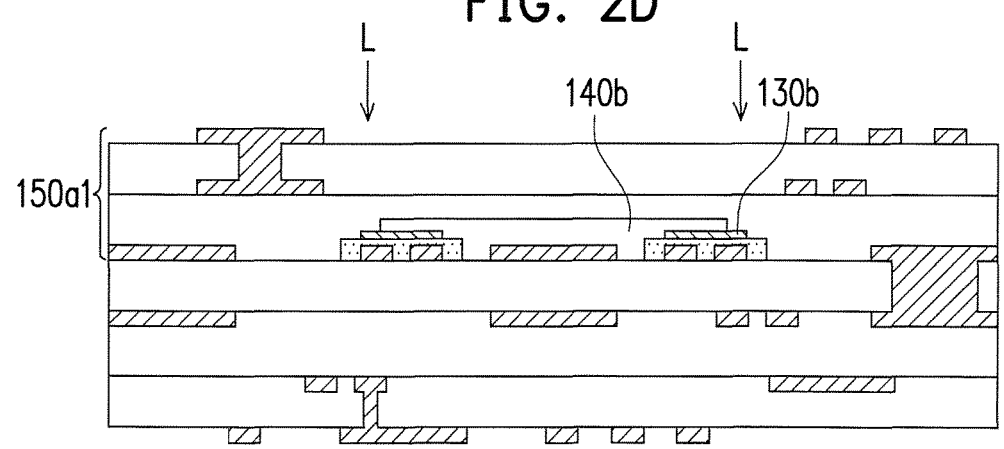
Figure 2F:
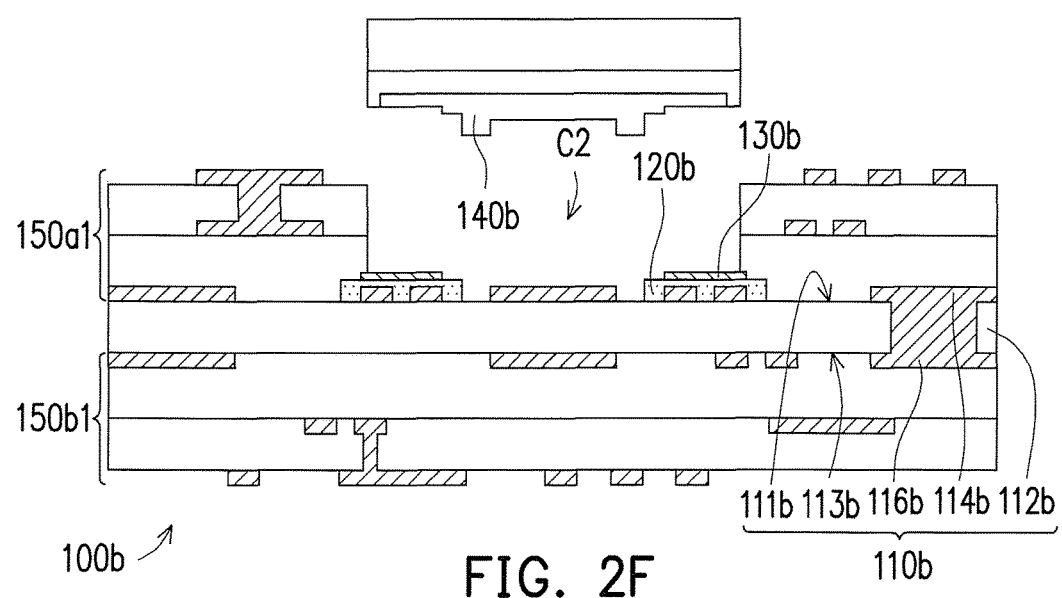

Finally, referring to FIG. 2E and FIG. 2F together, a laser ablation process is performed on the first build-up circuit structure 150a1 to irradiate a laser beam L on the laser resisting layer 130b so as to remove a portion of the first build-up circuit structure 150a1 and the release layer 140b, and thereby a cavity C2 at least exposing a portion of the upper surface 111b of the core layer 112b is formed. At this moment, the cavity C2 also exposes a portion of the insulating material layer 120b, a portion of the laser resisting layer 130b and a portion of the first patterned circuit layer 114b. Up to this step, the manufacture of a circuit board structure 100b has been completed.

In terms of structure, referring again to FIG. 2F, the circuit board structure 100b of the present embodiment includes the inner circuit structure 110b, the first build-up circuit structure 150a1, the insulating material layer 120b, the laser resisting layer 130b, and the second build-up circuit structure 150b1. The inner circuit structure 110b includes the core layer 112b having the upper surface 111b and the opposite lower surface 113b, the first patterned circuit layer 114b disposed on the upper surface 111b and the second patterned circuit layer 116b disposed on the lower surface 113b. The first build-up circuit structure 150a1 is disposed on the upper surface 111b of the core layer 112b and covers the first patterned circuit layer 114b, wherein the first build-up circuit structure 150a has the cavity C2, and the cavity C2 exposes a portion of the first patterned circuit layer 114b and a portion of the upper surface 111b of the core layer 112b. The insulating material layer 120b is disposed on the portion of the first patterned circuit layer 114b exposed by the cavity C2. The laser resisting layer 130b is disposed on the insulating material layer 120b, wherein the laser resisting layer 130b has a ring-shaped structure, and a portion of the first patterned circuit layer 114b is located in the ring-shaped structure. Preferably, a material of the laser resisting layer 130b is, e.g., a metal material (e.g., copper, nickel, gold, silver, aluminum or other suitable metal material), or non-metal (e.g., ceramic, quartz, carborundum or other suitable non-metal material). The second build-up circuit structure 150b1 is disposed on the lower surface 113b of the core layer 112b and covers the second patterned circuit layer 116b.

Figure 3A:
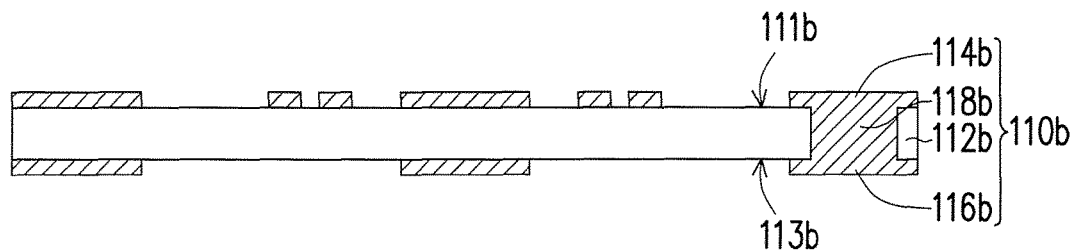
FIG. 3A to FIG. 3G illustrate cross-sectional schematic views of a manufacturing method of a circuit board structure according to another embodiment of the invention.

FIG. 3A to FIG. 3G illustrate cross-sectional schematic views of a manufacturing method of a circuit board structure according to another embodiment of the invention. Referring to FIG. 3A, with regard to the manufacturing method of a circuit board structure according to the present embodiment, first of all, an inner circuit structure 110b is provided, wherein the inner circuit structure 110b includes a core layer 112b having an upper surface 111b and an opposite lower surface 113b, a first patterned circuit layer 114b disposed on the upper surface 111b and a second patterned circuit layer 116b disposed on the lower surface 113b. As shown in FIG. 3A, the first patterned circuit layer 114b and the second patterned circuit layer 116b are electrically connected through at least one conductive through hole 118b passing through the core layer 112b.

Figure 3B:
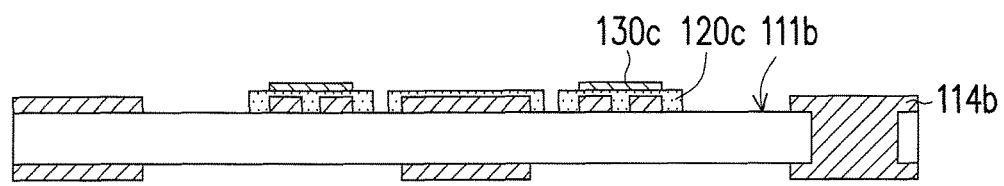

Next, referring to FIG. 3B, an insulating material layer 120c is formed on a portion of the first patterned circuit layer 114b, wherein the insulating material layer 120c covers a portion of the upper surface 111b. Herein, a material of the insulating material layer 120c is, e.g., ink, polypropylene (PP), polyethylene (PE), ABS (acrylonitrile butadiene styrene) resin, polytetrafluoroethene (PTFE) or other suitable material. Next, referring again to FIG. 3B, a laser resisting layer 130c is formed on a portion of the insulating material layer 120c. As shown in FIG. 3B, the laser resisting layer 130c of the present embodiment is not completely formed on the insulating material layer 120c but is formed on only a portion of the insulating material layer 120c, and does not completely cover the insulating material layer 120c. Specifically, the laser resisting layer 130c has a ring-shaped structure, wherein an area where the laser resisting layer 130c is present is an area where subsequent laser ablation is performed, and a portion of the first patterned circuit layer 114b is located in the ring-shaped structure. Moreover, the first patterned circuit layer 114b located in the ring-shaped structure has no laser resisting layer 130c thereon. Herein, a material of the laser resisting layer 130c is, e.g., a metal material (e.g., copper, nickel, gold, silver, aluminum or other suitable metal material), or non-metal (e.g., ceramic, quartz, carborundum or other suitable non-metal material).

Figure 3C:
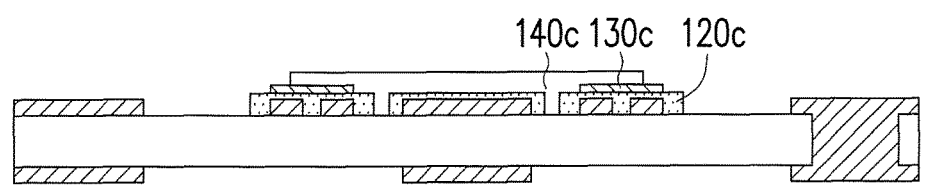

Next, referring to FIG. 3C, a release layer 140c is adhered to the laser resisting layer 130c and the insulating material layer 120c, wherein the release layer 140c directly covers the laser resisting layer 130c and the insulating material layer 120c, and exposes a portion of the laser resisting layer 130c and a portion of the insulating material layer 120c.

Figure 3D:
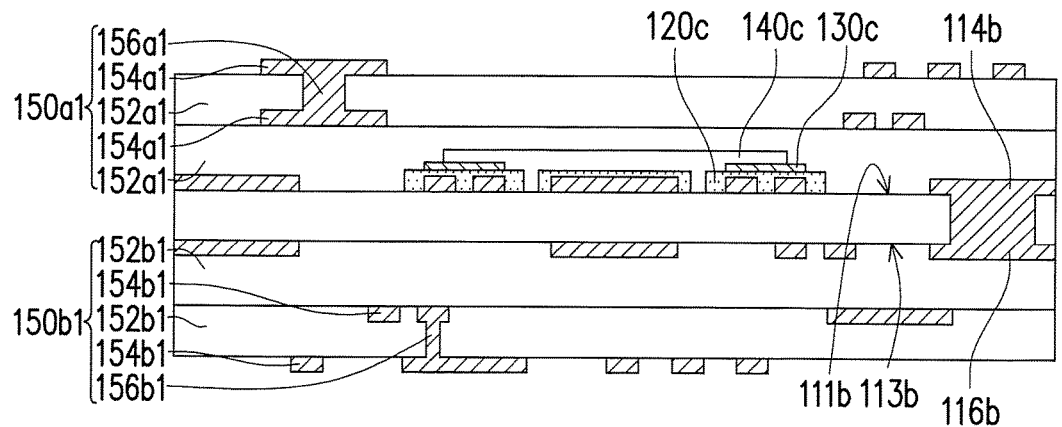

Next, referring to FIG. 3D, a build-up process is performed so as to laminate a first build-up circuit structure 150a1 and a second build-up circuit structure 150b1 on the first patterned circuit layer 114b and the second patterned circuit layer 116b, respectively, wherein the first build-up circuit structure 150a1 covers the release layer 140c, a portion of the laser resisting layer 130c and a portion of the insulating material layer 120c. In detail, the first build-up circuit structure 150a1 of the present embodiment includes at least one first dielectric layer 152a1, at least one first patterned conductive layer 154a1, and at least one first conductive through hole structure 156a1 passing through the first dielectric layer 152a1. The first dielectric layer 152a1 and the first patterned conductive layer 154a1 are stacked in sequence on the upper surface 111b of the core layer 112b, and the first patterned conductive layer 154a1 is electrically connected to the first patterned circuit layer 114b through the first conductive through hole structure 156a1. The second build-up circuit structure 150b1 includes at least one second dielectric layer 152b1, at least one second patterned conductive layer 154b1, and at least one second conductive through hole structure 156b1 passing through the second dielectric layer 152b1. The second dielectric layer 152b1 and the second patterned conductive layer 154b1 are stacked in sequence on the lower surface 113b of the core layer 112b, and the second patterned conductive layer 154b1 is electrically connected to the second patterned circuit layer 116b through the second conductive through hole structure 156b1.

Figure 3E:
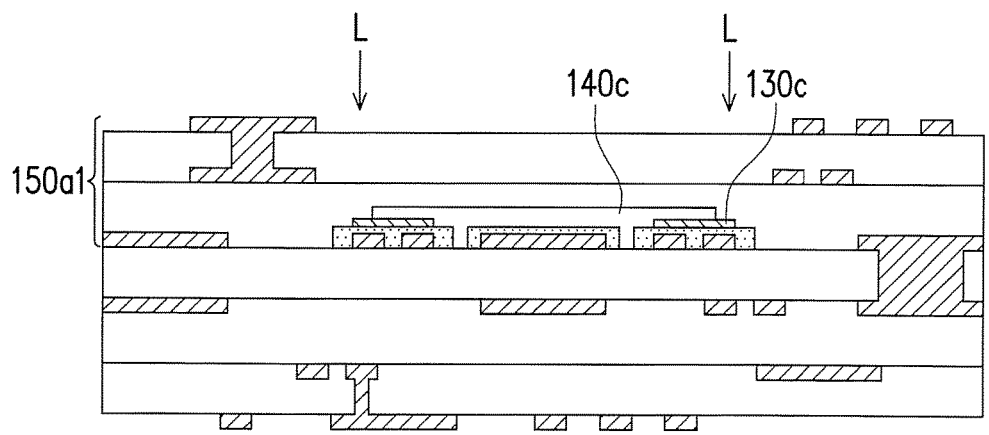
Figure 3F:
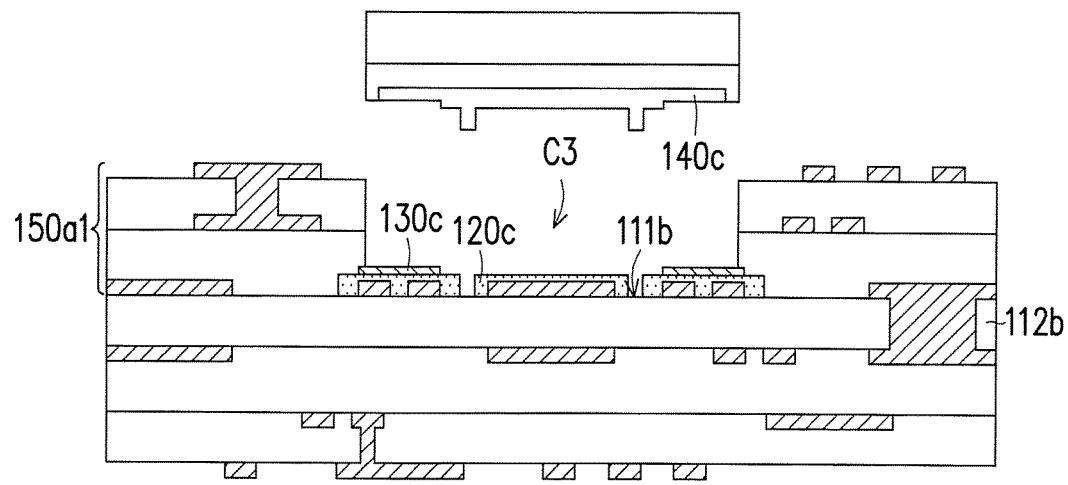

Then, referring to FIG. 3E and FIG. 3F together, a laser ablation process is performed on the first build-up circuit structure 150a1 to irradiate a laser beam L on the laser resisting layer 130c so as to remove a portion of the first build-up circuit structure 150a1 and the release layer 140c, and thereby a cavity C3 at least exposing a portion of the upper surface 111b of the core layer 112b is formed. At this moment, the cavity C3 also exposes a portion of the insulating material layer 120c and a portion of the laser resisting layer 130c.

Figure 3G:
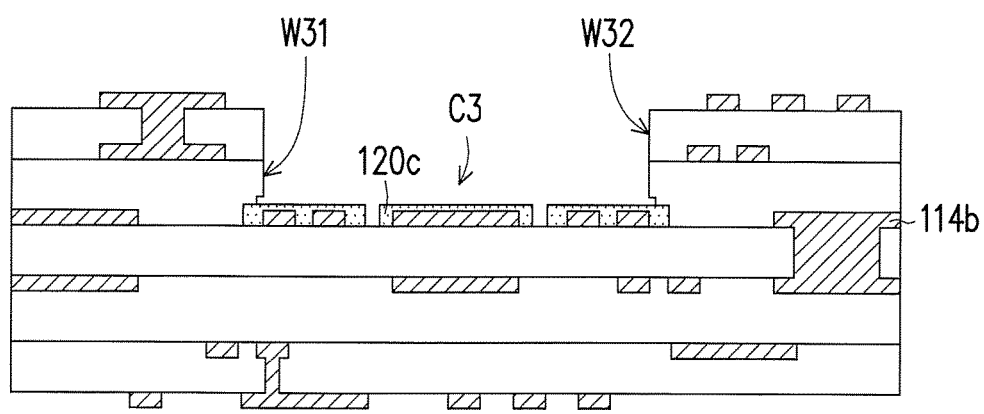

Finally, referring to FIG. 3F and FIG. 3G together, the laser resisting layer 130c is removed so as to form the cavity C3 including side walls W31 and W32 having a concave-and-convex profile, wherein a method of removing the laser resisting layer 130c is, e.g., dissolving the insulating material layer 120c on the lower side in a lye or an organic solvent so that the laser resisting layer 130c naturally falls down. Up to this step, the manufacture of a circuit board structure 100c has been completed.

In terms of structure, referring again to FIG. 3G, the circuit board structure 100c of the present embodiment is similar to the circuit board structure 100b in FIG. 2F, and the differences therebetween lie in that the circuit board structure 100c of the present embodiment includes no laser resisting layer 130c, the first patterned circuit layer 114b exposed by the cavity C3 is entirely covered by the insulating material layer 120c, and the side walls W31 and W32 of the cavity C3 have a concave-and-convex profile.

Figure 4A:
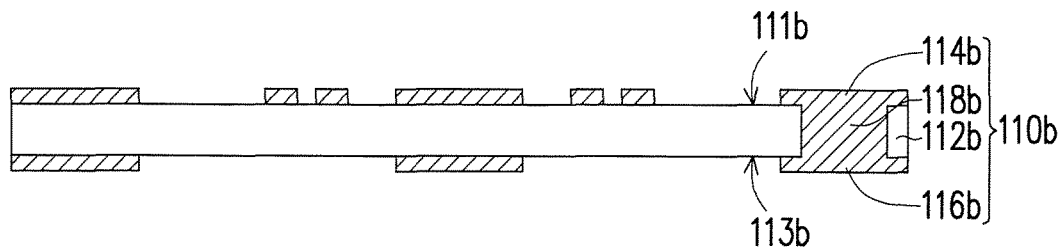
FIG. 4A to FIG. 4F illustrate cross-sectional schematic views of a manufacturing method of a circuit board structure according to another embodiment of the invention.

FIG. 4A to FIG. 4F illustrate cross-sectional schematic views of a manufacturing method of a circuit board structure according to another embodiment of the invention. Referring to FIG. 4A, with regard to the manufacturing method of a circuit board structure according to the present embodiment, first of all, an inner circuit structure 110b is provided, wherein the inner circuit structure 110b includes a core layer 112b having an upper surface 111b and an opposite lower surface 113b, a first patterned circuit layer 114b disposed on the upper surface 111b and a second patterned circuit layer 116b disposed on the lower surface 113b. As shown in FIG.

4A, the first patterned circuit layer 114b and the second patterned circuit layer 116b are electrically connected through at least one conductive through hole 118b passing through the core layer 112b.

Figure 4B:
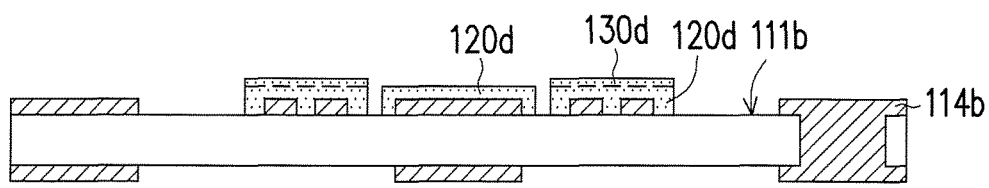

Next, referring to FIG. 4B, an insulating material layer 120d is formed on a portion of the first patterned circuit layer 114b, wherein the insulating material layer 120d covers a portion of the upper surface 111b. Herein, a material of the insulating material layer 120d is, e.g., ink, polypropylene (PP), polyethylene (PE), ABS (acrylonitrile butadiene styrene) resin, polytetrafluoroethene (PTFE) or other suitable material. Next, referring again to FIG. 4B, a laser resisting layer 130d is formed on a portion of the insulating material layer 120d. As shown in FIG. 4B, the laser resisting layer 130d of the present embodiment is not completely formed on the insulating material layer 120d but is formed on only a portion of the insulating material layer 120d, and does not completely cover the insulating material layer 120d. Specifically, the laser resisting layer 130d has a ring-shaped structure, wherein an area where the laser resisting layer 130d is present is an area where subsequent laser ablation is performed, and a portion of the first patterned circuit layer 114b is located in the ring-shaped structure. Moreover, the first patterned circuit layer 114b located in the ring-shaped structure has no laser resisting layer 130d thereon. Particularly, a material of the laser resisting layer 130d is the same as the material of the insulating material layer 120d. In other words, the material of the laser resisting layer 130d is also metal (e.g., copper, nickel, gold, silver, aluminum or other suitable metal material), or non-metal (e.g., ceramic, quartz, carborundum or other suitable non-metal material).

Figure 4C:
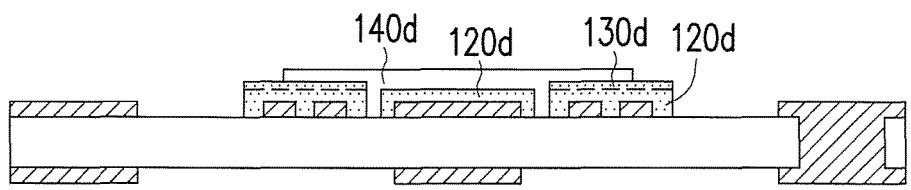

Next, referring to FIG. 4C, a release layer 140d is adhered to the laser resisting layer 130d and the insulating material layer 120d, wherein the release layer 140d directly covers the laser resisting layer 130d and the insulating material layer 120d, and exposes a portion of the laser resisting layer 130d.

Figure 4D:
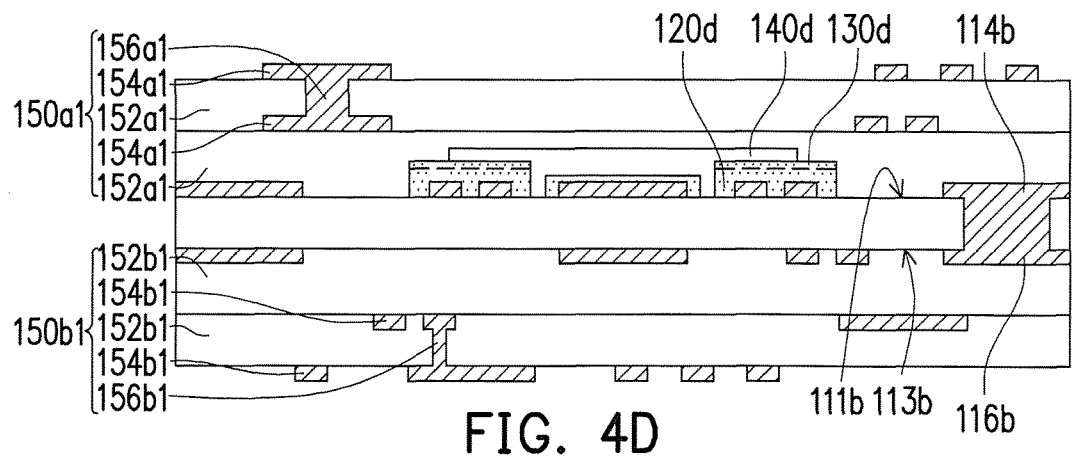

Next, referring to FIG. 4D, a build-up process is performed so as to laminate a first build-up circuit structure 150a1 and a second build-up circuit structure 150b1 on the first patterned circuit layer 114b and the second patterned circuit layer 116b, respectively, wherein the first build-up circuit structure 150a1 covers the release layer 140d, a portion of the laser resisting layer 130d and a portion of the insulating material layer 120d. In detail, the first build-up circuit structure 150a1 of the present embodiment includes at least one first dielectric layer 152a1, at least one first patterned conductive layer 154a1, and at least one first conductive through hole structure 156a1 passing through the first dielectric layer 152a1. The first dielectric layer 152a1 and the first patterned conductive layer 154a1 are stacked in sequence on the upper surface 111b of the core layer 112b, and the first patterned conductive layer 154a1 is electrically connected to the first patterned circuit layer 114b through the first conductive through hole structure 156a1. The second build-up circuit structure 150b1 includes at least one second dielectric layer 152b1, at least one second patterned conductive layer 154b1, and at least one second conductive through hole structure 156b1 passing through the second dielectric layer 152b1. The second dielectric layer 152b1 and the second patterned conductive layer 154b1 are stacked in sequence on the lower surface 113b of the core layer 112b, and the second patterned conductive layer 154b1 is electrically connected to the second patterned circuit layer 116b through the second conductive through hole structure 156b1.

Figure 4E:
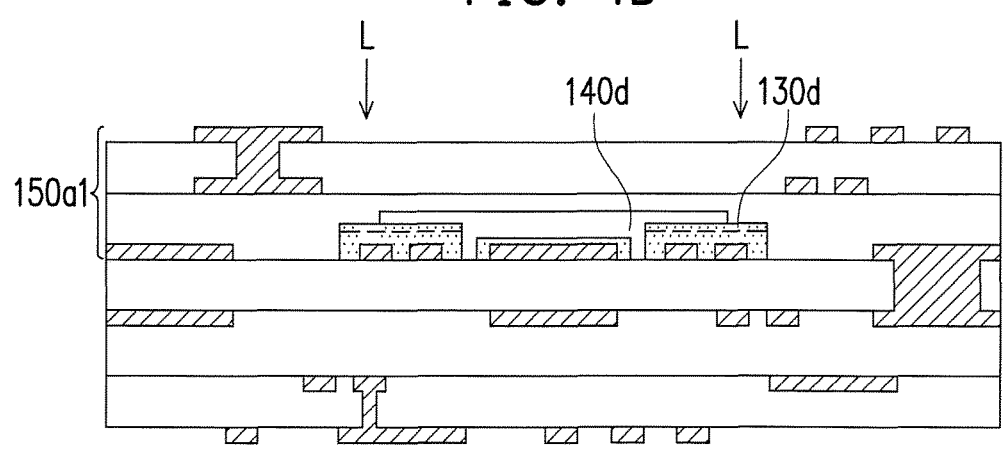
Figure 4F:
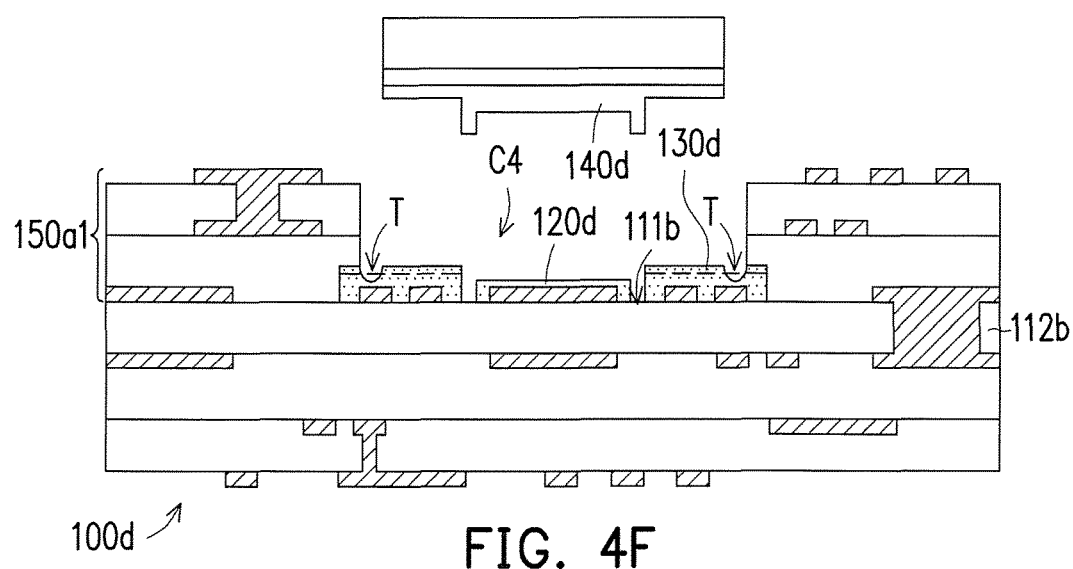

Then, referring to FIG. 4E and FIG. 4F together, a laser ablation process is performed on the first build-up circuit structure 150a1 to irradiate a laser beam L on the laser resisting layer 130d so as to remove a portion of the first build-up circuit structure 150a1 and the release layer 140d, and thereby a cavity C4 at least exposing a portion of the upper surface 111b of the core layer 112b is formed. While the laser ablation process is performed on the first build-up circuit structure 150a1 to remove the portion of the first build-up circuit structure 150a1 and the release layer 140d, a portion of the laser resisting layer 130d and a portion of the insulating material layer 120d are removed, and thereby the cavity C4 exposing a portion of the insulating material layer 120d, a portion of the laser resisting layer 130d and a portion of the upper surface 111b of the core layer 112b is formed. In other words, the cavity C4 also exposes a portion of the insulating material layer 120d and a portion of the laser resisting layer 130d. Up to this step, the manufacture of a circuit board structure 100d has been completed.

In terms of structure, referring again to FIG. 4F, the circuit board structure 100d of the present embodiment is similar to the circuit board structure 100b in FIG. 2F, and the differences therebetween lie in that in the circuit board structure 100d of the present embodiment, the material of the laser resisting layer 130d is the same as the material of the insulating material layer 120d, and the laser resisting layer 130d has an opening T extending to the insulating material layer 120d due to the laser ablation. The cavity C4 exposes a portion of the laser resisting layer 130d, a portion of the insulating material layer 120d and a portion of the upper surface 111b of the core layer 112b.

In summary, during the manufacture of the circuit board structure of the invention, the laser resisting layer is formed on the insulating material layer instead of the inner circuit structure. Therefore, subsequently, after the build-up circuit structures are fabricated, when the laser ablation process is performed to form the cavity that exposes the upper surface of the core layer of the inner circuit structure, the circuit layout of the core layer of the inner circuit structure will not be affected. That is, circuit designing can still be carried out in the resulting cavity. Therefore, the circuit board structure formed in the invention provides larger layout space.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:
1. A circuit board structure, comprising:
an inner circuit structure, comprising a core layer having an upper surface and an opposite lower surface, a first patterned circuit layer disposed on the upper surface and a second patterned circuit layer disposed on the lower surface;
a first build-up circuit structure, disposed on the upper surface of the core layer and covering the first patterned circuit layer, wherein the first build-up circuit structure has a cavity, the cavity exposes a portion of the first patterned circuit layer and a portion of the upper surface of the core layer, and the cavity comprises a plurality of side walls, and the side walls have a concave-and-convex profile, or a combination of concave-and-convex and plane profiles, wherein a diameter of the cavity varies from an outermost portion of a first patterned conductive layer of the first build-up circuit structure to the first patterned circuit layer, and a portion of the first patterned conductive layer is adjacent to the cavity; and a second build-up circuit structure, disposed on the lower surface of the core layer and covering the second patterned circuit layer.

2. The circuit board structure as recited in claim 1, wherein the first build-up circuit structure comprises at least one first dielectric layer, at least one the first patterned conductive layer, and at least one first conductive through hole structure passing through the first dielectric layer, the first dielectric layer and the first patterned conductive layer are stacked in sequence on the upper surface of the core layer, and the first patterned conductive layer is electrically connected to the first patterned circuit layer through the first conductive through hole structure, and wherein the second build-up circuit structure comprises at least one second dielectric layer, at least one second patterned conductive layer, and at least one second conductive through hole structure passing through the second dielectric layer, the second dielectric layer and the second patterned conductive layer are stacked in sequence on the lower surface of the core layer, and the second patterned conductive layer is electrically connected to the second patterned circuit layer through the second conductive through hole structure.

3. A circuit board structure, comprising:

an inner circuit structure, comprising a core layer having an upper surface and an opposite lower surface, a first patterned circuit layer disposed on the upper surface and a second patterned circuit layer disposed on the lower surface;

a first build-up circuit structure, disposed on the upper surface of the core layer and covering the first patterned circuit layer, wherein the first build-up circuit structure has a cavity, and the cavity exposes a portion of the first patterned circuit layer and a portion of the upper surface of the core layer;

an insulating material layer, disposed on the portion of the first patterned circuit layer exposed by the cavity;

a laser resisting layer, disposed on the insulating material layer, wherein the laser resisting layer is in direct contact with the insulating material layer, the laser resisting layer has a ring-shaped structure, and a portion of the first patterned circuit layer is located under a center of the ring-shaped structure; and a second build-up circuit structure, disposed on the lower surface of the core layer and covering the second patterned circuit layer.

4. The circuit board structure as recited in claim 3, wherein a material of the laser resisting layer is a metal material.

5. The circuit board structure as recited in claim 3, wherein a material of the laser resisting layer is the same as a material of the insulating material layer.

6. The circuit board structure as recited in claim 3, wherein the first build-up circuit structure comprises at least one first dielectric layer, at least one first patterned conductive layer, and at least one first conductive through hole structure passing through the first dielectric layer, the first dielectric layer and the first patterned conductive layer are stacked in sequence on the upper surface of the core layer, and the first patterned conductive layer is electrically connected to the first patterned circuit layer through the first conductive through hole structure, and wherein the second build-up circuit structure comprises at least one second dielectric layer, at least one second patterned conductive layer, and at least one second conductive through hole structure passing through the second dielectric layer, the second dielectric layer and the second patterned conductive layer are stacked in sequence on the lower surface of the core layer, and the second patterned conductive layer is electrically connected to the second patterned circuit layer through the second conductive through hole structure.

* * * * *